(12) United States Patent
Carvajal et al.

(10) Patent No.: US 10,133,831 B2
(45) Date of Patent: Nov. 20, 2018

(54) METHOD AND SYSTEM OF PREDICTING FUTURE HYDROCARBON PRODUCTION

(71) Applicant: Landmark Graphics Corporation, Houston, TX (US)

(72) Inventors: Gustavo A. Carvajal, Houston, TX (US); Alvin S. Cullick, Houston, TX (US); Hatem Nasr, Houston, TX (US); Douglas W. Johnson, Austin, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 707 days.

(21) Appl. No.: 14/381,337

(22) PCT Filed: Mar. 13, 2013

(86) PCT No.: PCT/US2013/031022
§ 371 (c)(1),
(2) Date: Aug. 27, 2014

(87) PCT Pub. No.: WO2013/172948
PCT Pub. Date: Nov. 21, 2013

(65) Prior Publication Data
US 2015/0051892 A1  Feb. 19, 2015

Related U.S. Application Data

(60) Provisional application No. 61/646,420, filed on May 14, 2012.

(51) Int. Cl.
*G06F 17/50* (2006.01)
*E21B 43/00* (2006.01)
(Continued)

(52) U.S. Cl.
CPC .......... *G06F 17/5009* (2013.01); *E21B 43/00* (2013.01); *G01V 99/005* (2013.01); *G06N 3/10* (2013.01)

(58) Field of Classification Search
CPC .... G06F 17/5009; G01V 99/005; G06N 3/10; E21B 43/00
(Continued)

(56) References Cited

U.S. PATENT DOCUMENTS 6,574,565 B1 * 6/2003 Bush ................... G01V 1/30
702/13
7,289,942 B2 * 10/2007 Yang ................... E21B 43/16
166/305.1
(Continued)

FOREIGN PATENT DOCUMENTS

EP       1679424 A2    7/2006
WO   WO-2009075946 A1  6/2009
WO    WO2011073861    6/2011

OTHER PUBLICATIONS

Lechner J P et al., Treating Uncertainties in Reservoir Performance Prediction with Neural Networks, Jun. 13-16, 2005, 8 pages, Society of Petroleum Engineers (SPE) 94357, Madrid, Spain.
(Continued)

*Primary Examiner* — Andre Pierre Louis

(57) ABSTRACT

Predicting future hydrocarbon production. At least some of the illustrative embodiments are methods including: reading data regarding hydrocarbon production from a hydrocarbon producing field; producing at least one value indicative of future hydrocarbon production based on a data model and the data regarding hydrocarbon production; displaying, on a display device of a computer system, an indication of historic data regarding hydrocarbon production; and displaying, on the display device, an indication of the at least one value indicative of future hydrocarbon production.

22 Claims, 8 Drawing Sheets

(51) Int. Cl.
*G01V 99/00* (2009.01)
*G06N 3/10* (2006.01)

(58) Field of Classification Search
USPC .................................................. 703/9, 10
See application file for complete search history.

(56) References Cited

U.S. PATENT DOCUMENTS

| | | |
|---|---|---|
| 2003/0047308 A1 | 3/2003 | Hirsch et al. |
| 2003/0110017 A1 | 6/2003 | Guthrie et al. |
| 2007/0016389 A1* | 1/2007 | Ozgen ............... E21B 49/00 703/10 |
| 2008/0082469 A1 | 4/2008 | Wilkinson et al. |
| 2008/0230219 A1* | 9/2008 | Kaminsky ........... E21B 36/04 166/248 |
| 2009/0084545 A1 | 4/2009 | Banerjee et al. |
| 2009/0166033 A1* | 7/2009 | Brouwer ............. E21B 43/00 166/250.02 |
| 2010/0169019 A1 | 7/2010 | Zhan et al. |
| 2010/0206559 A1* | 8/2010 | Sequeira, Jr. ........ G01V 99/00 166/250.15 |
| 2011/0168391 A1 | 7/2011 | Saleri et al. |
| 2011/0290478 A1 | 12/2011 | Sun et al. |
| 2011/0295508 A1 | 12/2011 | Lee et al. |
| 2013/0116998 A1* | 5/2013 | Shirzadi ............ E21B 43/20 703/10 |

OTHER PUBLICATIONS

Thiele M.R., Batycky R.P., Fenwick D.H., Streamline Simulation for Modern Reservoir-Engineering Workflows, Jan. 2010, 7 pages, Journal of Petroleum Technology, Society of Petroleum Engineers (SPE) 118608.

European Patent Office, Search Report, dated Jan. 5, 2016, 7 pages, Europe.

The Federal Institute of Industrial Property, Office Action, dated Dec. 21, 2015, 6 pages, Russia.

PCT Application No. PCT/US2013/031022, Search Report and Written Opinion dated Jun. 25, 2013.

* cited by examiner

METHOD AND SYSTEM OF PREDICTING FUTURE HYDROCARBON PRODUCTION

BACKGROUND

A variety of software modeling tools exists to assist in planning for and extraction of hydrocarbons from underground reservoirs. For example, a geologist or reservoir engineer may use a geocellular model of the underground formation to make decisions regarding hydrocarbon well placement. The geocellular model is a physics-based model, simulating fluid movement through pores in the rock of the formation. Geocellular models require extensive computing capability to create, modify if necessary, and "run" the model to simulate fluid movement. The time step of each simulation run may be rather large, as the primary purpose of the geocellular model is to make long term planning decisions, and thus such simulations may predict movement of hydrocarbons within the formations years in advance. A geocellular model is too large and cumbersome to make accurate estimates of the production of a single hydrocarbon well over a short period of time (e.g., 180 days or less).

With respect to a single hydrocarbon well, other physics-based models are available. For example, a completions engineer may model hydrocarbon flow from the hydrocarbon well as a series of pressure drops between the fractured formation and the production flow line (e.g., perforation size and number, inside diameter of tubing string through which the hydrocarbons will flow, length of the tubing string). However, while such modeling may be useful in evaluating fracture scenarios, the pressure drop modeling is limited in its ability to test or simulate other scenarios related to production.

BRIEF DESCRIPTION OF THE DRAWINGS

For a detailed description of exemplary embodiments, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"Data model" shall mean model that predicts future results using, at least in part, historic data. A model that predicts future results by modeling hydrocarbon movement within a reservoir shall not be considered a data model.

"Real-time" in reference to an action (e.g., predicting future hydrocarbon production flow) shall mean the action takes places within one minute or less of a trigger event for the action. "Real-time" in reference to data shall mean that the data was created, read, or updated within one minute or less.

DETAILED DESCRIPTION

The following discussion is directed to various embodiments of the invention. Although one or more of these embodiments may be preferred, the embodiments disclosed should not be interpreted, or otherwise used, as limiting the scope of the disclosure or claims. In addition, one skilled in the art will understand that the following description has broad application, and the discussion of any embodiment is meant only to be exemplary of that embodiment, and not intended to intimate that the scope of the disclosure or claims is limited to that embodiment.

At least some of the various embodiments are directed to methods and systems of predicting future hydrocarbon production from a hydrocarbon well. More particularly, at least some embodiments are directed to a computer-implemented methodology for predicting future hydrocarbon production of a hydrocarbon well that enables a production engineer to test how proposed changes regarding hydrocarbon production (e.g., secondary recovery fluid injection rate, choke settings) affect hydrocarbon production. The specification first turns to an illustrative hydrocarbon producing field to orient the reader to the physical structure at issue, and then to various embodiments of predicting future hydrocarbon production.

Figure 1:
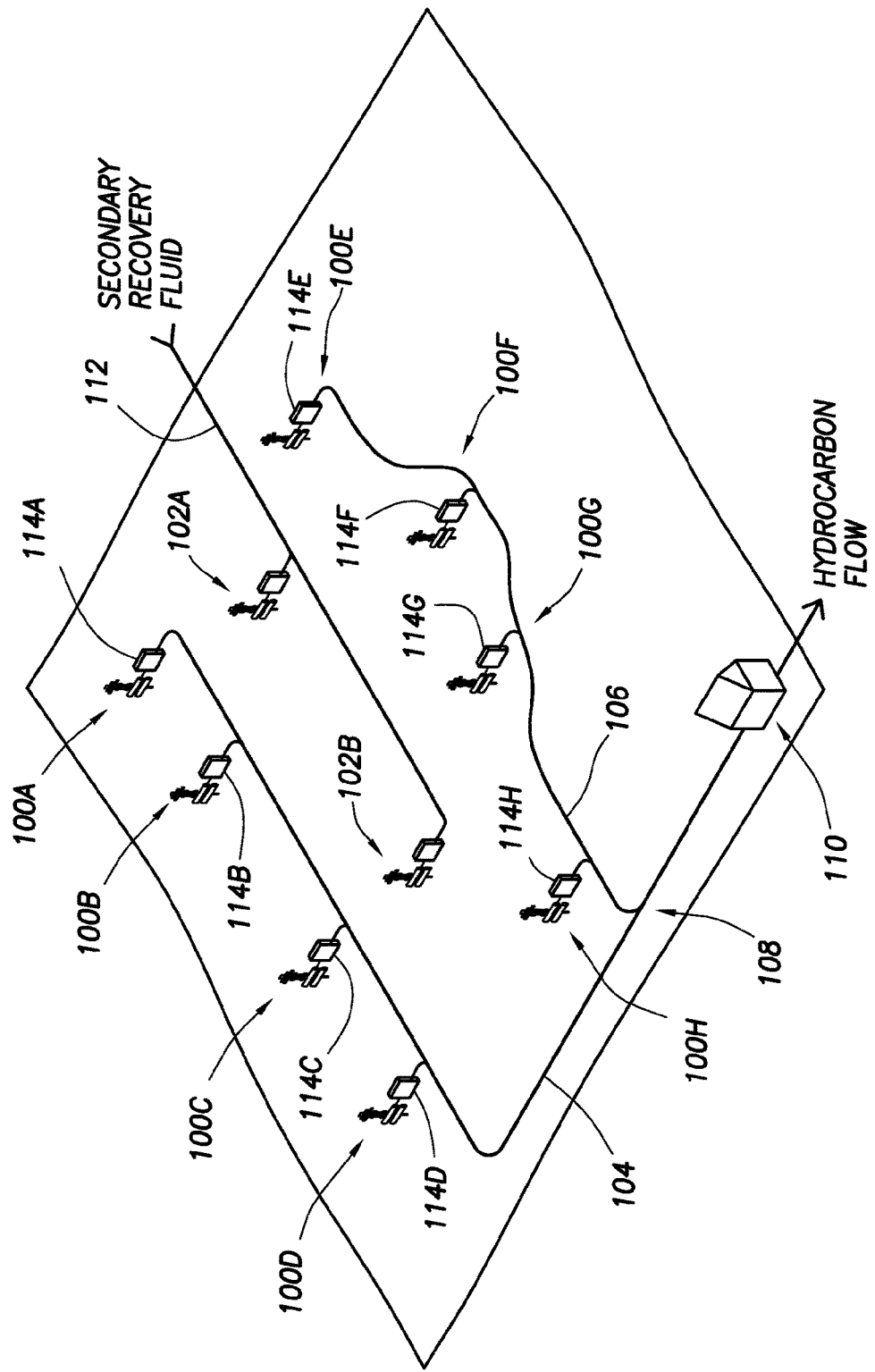
FIG. 1 shows a perspective view of a hydrocarbon producing field in accordance with at least some embodiments.

FIG. 1 shows a perspective view of a hydrocarbon producing field in accordance with at least some embodiments. In particular, the hydrocarbon producing field comprises a plurality of wellbores. Some wellbores are wellbores out which hydrocarbons flow (i.e., hydrocarbon wells), and other wellbores are used for injection of secondary recovery fluids, such as water or compressed carbon dioxide (i.e., injection wells). In the illustrative case of FIG. 1, wellbores 100 (labeled 100A through 100H) are hydrocarbon wells, and wellbores 102 (labeled 102A and 102B) are injection wells. The location of each wellbore is symbolized in the FIG. 1 by a valve stack, sometimes referred to as a "Christmas tree" in the industry, based primarily on its shape. The location of each wellbore may seem random when viewed from above, but in most cases has a layout to increase the extraction of hydrocarbons from the underlying formation (not shown).

In order to gather the produced hydrocarbons for sale, the hydrocarbon field has one more production flow lines (sometimes "production line"). In FIG. 1, production line 104 gathers hydrocarbons from illustrative hydrocarbon wells 100A-100D, and production line 106 gathers hydrocarbons from illustrative hydrocarbon wells 100E-100G. The production lines 104 and 106 tie together at point 108, and then flow to a metering facility 110.

In some cases, the secondary recovery fluid is delivered to the injection wells by way of trucks, and thus the secondary recovery fluid may only be pumped into the formation on a periodic basis (e.g., daily, weekly). In other embodiments, and as illustrated, the second recovery fluid is provided under pressure to the injection wells 102A and 102B by way of pipes 112.

The hydrocarbon producing field of FIG. 1 illustratively has eight hydrocarbon wells, and two injection wells; however, the number of wells is merely illustrative. In practice, a hydrocarbon producing field may have many tens or even hundreds of wellbores. The illustration of FIG. 1 is presented with a limited number of wellbores so as not to unduly complicate the figure and the discussion, but such should not be read as a limitation as the applicability of the various embodiments.

In accordance with at least some embodiments, each hydrocarbon well 100 has at least one, and in some cases more than one, measurement device for measuring parameters associated with the hydrocarbon production. FIG. 1 illustrates the measurement devices as devices 114A-114H associated one each with each hydrocarbon well 100A-100H, respectively. The measurement devices may take many forms, and the measurement devices need not be the same across all the hydrocarbon wells 100. In some cases, the measurement device may be related to the type of lift employed (e.g., electric submersible, gas lift, pump jack). In other cases, the measurement device on a hydrocarbon well may be selected based on a particular quality of hydrocarbons produced, such as a tendency to produce excess water. With the idea in mind that many variations on the selection of measurement devices are possible, even for similarly situated wells, the specification now turns to an example list of such devices.

In some cases, one or more of the measurement devices 114 may be a multi-phase flow meter. A multi-phase flow meter has the ability to not only measured hydrocarbon flow from a volume standpoint, but also give an indication of the mixture of oil and gas in the flow. One or more of the measurement devices may be oil flow meters, having the ability to discern oil flow, but not necessarily natural gas flow. One or more of the measurement devices may be natural gas flow meters. One or more of the measurement devices may be water flow meters. One or more of the measurement devices may be pressure transmitters measuring the pressure at any suitable location, such as at the wellhead, or within the borehole near the perforations. In the case of measurement devices associated with the lift provided, the measurement devices may be voltage measurement devices, electrical current measurement devices, pressure transmitters measuring gas lift pressure, frequency meter for measuring frequency of applied voltage to electric submersible motor coupled to a pump, and the like. Moreover, multiple measurement devices may be present on any one hydrocarbon producing well. For example, a well where artificial lift is provided by an electric submersible may have various devices for measuring hydrocarbon flow at the surface, and also various devices for measuring performance of the submersible motor and/or pump. As another example, a well where artificial lift is provided by a gas lift system may have various devices for measuring hydrocarbon flow at the surface, and also various measurement devices for measuring performance of the gas lift system.

Figure 2:
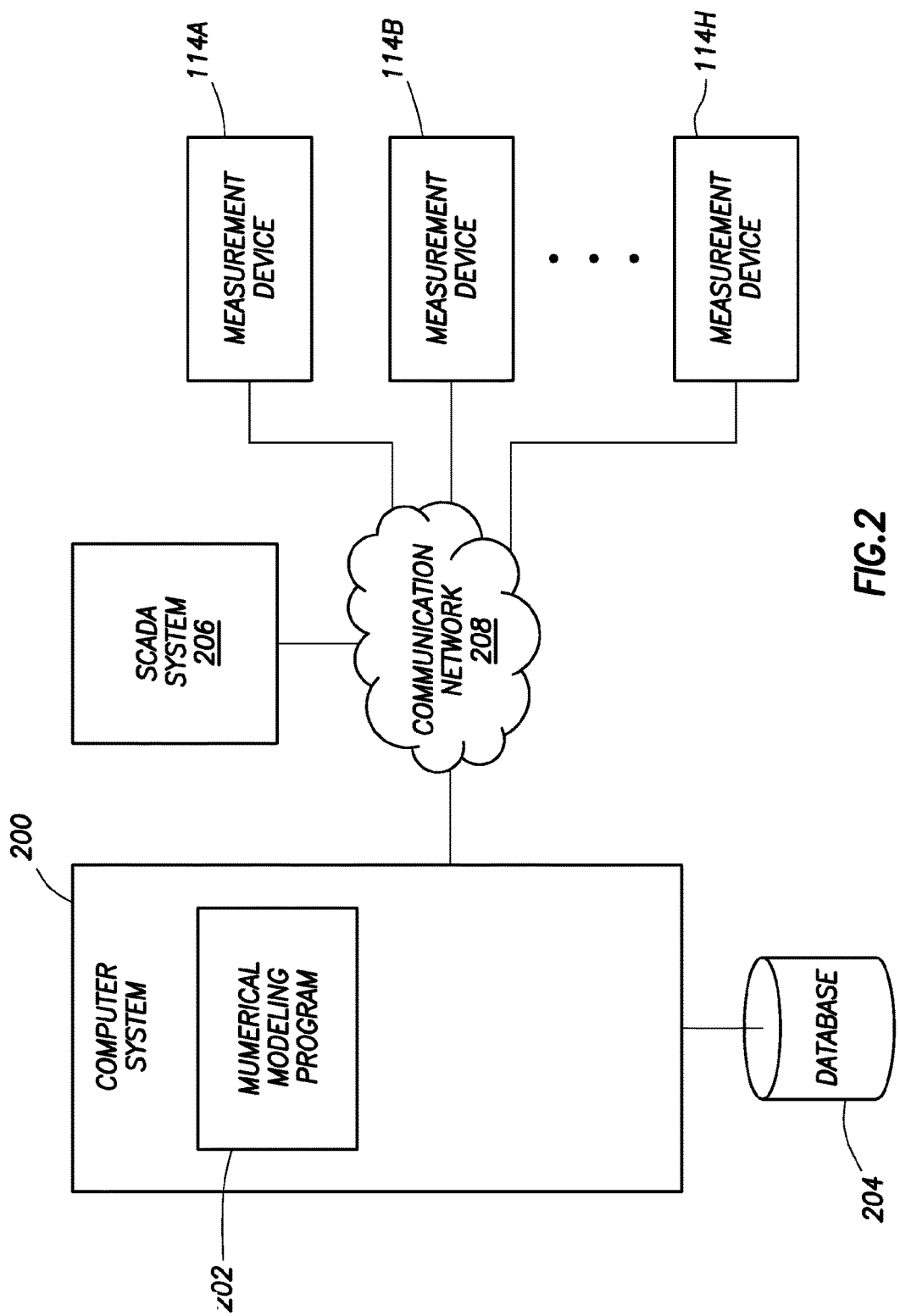
FIG. 2 shows a block diagram of a system in accordance with at least some embodiments.

FIG. 2 shows a block diagram of system in accordance with at least some embodiments. In particular, the system comprises a computer system 200 upon which one or more programs are executed. The computer system may take any suitable form. In some cases, the computer system 200 is a server system located at a data center associated with the hydrocarbon producing field. The data center may be physically located on or near the field, or the data center may be many hundreds or thousand of miles from the hydrocarbon producing field. In other cases, computer system 200 may be a laptop or desktop computer system. In yet still other cases, the computer system 200 may be a conglomeration of computer devices, such as portable devices communicatively coupled to other computer systems. Further still, the computer system 200 may be "cloud" computer systems, such that the precise location of the computer systems is not known to the user, or may change based on the computer load presented.

Regardless of the precise nature of the computer system 200, the computer system executes one or more programs that predict future hydrocarbon production of a well, and display the prediction on a display device. The one or more programs are illustrated as numerical modeling program 202. Numerical modeling program 202 reads data regarding a hydrocarbon well, and predicts future hydrocarbon production. The numerical modeling program 202 is referred to as "numerical" as the prediction is based on a numerical- or data-model, rather than a physics-based model. That is to say, the predictions as to future hydrocarbon production are based on data regarding hydrocarbon production from hydrocarbon producing field, as well as data specific to the hydrocarbon well under scrutiny. Fluid movement within the hydrocarbon formation between hydrocarbon wells, or between a hydrocarbon well and an injector well, is not simulated in arriving at the prediction of future hydrocarbon production. Moreover, in some cases, the numerical modeling program enables the production engineer to change data applied to the data-model to test various scenarios, and in some cases the new predictions as to future hydrocarbon production are produced in real-time with the changed data.

Numerical modeling program 202 makes the predictions of future hydrocarbon production based on a variety of data. In some embodiments, the data upon which the predictions are made are historical data, such as data stored in a database 204 coupled to the computer system 200. For example, given time lags between changes in injection rate of secondary recovery fluids and changes in hydrocarbon production rate, the numerical model may read or be provided historical data as to rate of secondary recovery fluid injection.

In some cases, the information upon which the predictions of future hydrocarbon are based on real-time data. For example, the predictions may be based on the current data associated with hydrocarbon production, such as current hydrocarbon flow, current wellhead pressure, current secondary recovery fluid injection rate, current gas lift pressure, or current frequency applied to the electric submersible pump. The real-time data may be read from a supervisory control and data acquisition (SCADA) system 206 (which SCADA system itself may implement a database of historical values), coupled to the computer system 200 by way of a communication network 208. In other cases, the data upon which predictions as to future hydrocarbon flow are made may come directly to the computer system 200 from the measurement devices 114 themselves, coupled to the computer system 200 by way of the communication network 208.

The communication network 206 may take any suitable form. In some cases, the communication network 208 is a dedicated local- or wide-area network to which the various devices are coupled. In other cases, the communication network may involve in whole or in part the Internet, such as a virtual private network (VPN) carried over the Internet. From a hardware stand point the communication network may involve electrical conductors, optical conductors, radio frequency electromagnetic wave signals propagated point-to-point, and/or satellite based communication. Regardless of the type of communication network used, the computer system communicates with one or more devices to obtain data for predicting future hydrocarbon production.

Figure 3:
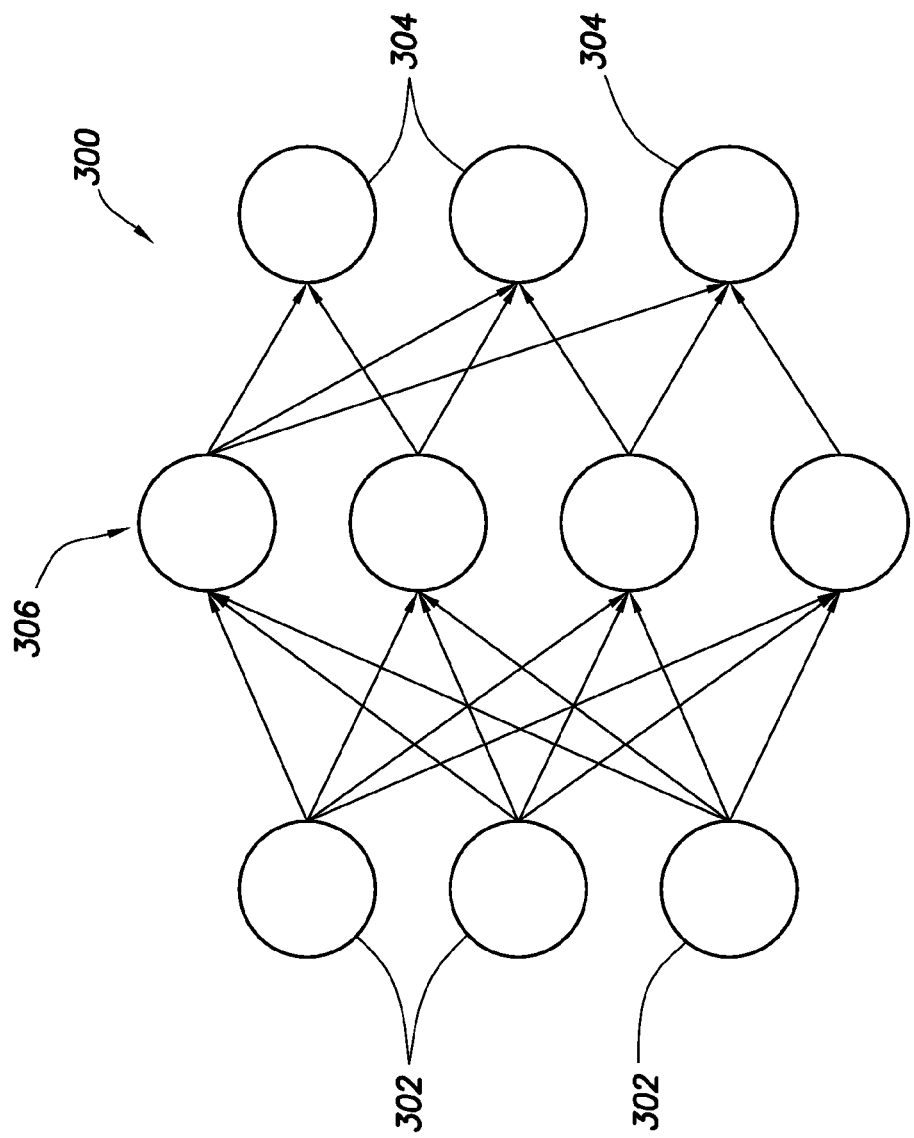
FIG. 3 shows an artificial neural network in accordance with at least some embodiments.

In accordance with at least some embodiments, the numerical modeling program 202 is implemented, at least in part, as an artificial neural network (hereafter just "neural network"). A brief digression into neural networks is helpful in understanding the innovative contributions of the inventors. In particular, FIG. 3 illustrates a simplified neural network 300. The neural network 300 comprises a plurality of input nodes 302. Input nodes 302 are the points within the neural network to which a datum (i.e., a scalar value, a vector) is provided for further processing. Moreover, the neural network 300 comprises one or more output nodes 304. Each output node 304 represents a calculated and/or predicted parameter based on the input data at the input nodes 302. Between the input nodes 302 and the output nodes 304 are one or more layers of hidden nodes 306. As shown in FIG. 3, the hidden nodes 306 are coupled to some, or all, of the input nodes 302. Likewise, the hidden nodes 306 are coupled to some, or all, of the output nodes 304. Each of the hidden nodes 306 performs a mathematical function that is determined or learned during a training phase of the neural network 300. While the illustrative FIG. 3 shows three input nodes 302, three output nodes 304, and four hidden nodes 306, any number of input nodes 302 and output nodes 304 may be used. Likewise, any number of hidden nodes 306, and multiple layers of hidden nodes 306, may be used to implement the neural network 300.

In accordance with some embodiments, the data applied to the input nodes 302 is real-time well data regarding hydrocarbon flow of a hydrocarbon well. The real-time data may take many forms depending on the type of hydrocarbon well at issue. In the illustrative case of a natural flowing well in a water flood field, the real-time data applied to the input nodes 302 may comprise some or all of: choke valve setting; production flow line pressure; bottom hole pressure; pressure at the wellhead; hydrocarbon temperature measured proximate to the wellhead; measured oil flow rate; measured gas flow rate; measured water flow rate; water injection rate at one or more injection wells; and well on-stream time (i.e., time since last shut in). In the illustrative case of a gas lift well, the real-time data applied to the input nodes may comprise any or all of the example data for natural flowing wells, and further comprising some or all of gas lift rate and pressure of the lifting gas applied. In the illustrative case of wells using an electric submersible pump for artificial lift, the real-time data applied to the input nodes may comprise any or all of the example data for natural flowing wells, and further comprising any or all of: frequency of the alternating current signal applied to the electric motor; instantaneous power consumption by the electric motor; suction pressure at the pump.

Moreover, in addition to the real-time data applied to the input nodes 302, various historical data may be applied to the input nodes. In the illustrative case of a hydrocarbon well in a water flood field, historical data in the form of past injection rates at nearby injection wells may be applied to the input nodes. For example, there may be nodes which accept the average injection rate over the last 10 days, 20 days, 30 days, and 60 days, such that changes in injection rate can be considered in the production of the predicted future hydrocarbon production rate. Thus, there may be some preprocessing of the historical data before application.

In accordance with at least some embodiments, the neural network 300 takes the input data at the inputs nodes 302, and through processing associated with the one or more hidden nodes, predicts parameters, which predicted parameters are available as data at the one or more output nodes 304. In a particular embodiment, the neural network produces three predicted values over a predetermined number of days in the future. The three illustrative predicted values are: daily oil rate; daily oil-to-gas ratio; and daily water cut. Other predicted parameters are possible. The predetermined number of days may be any suitable number of days into the future; however, as discussed more below the artificial neural network may be trained as a relatively short-term prediction tool, and thus the predetermined number of days may be relatively short considered in view of the life scale of the overall hydrocarbon field. In some cases, the predetermined number of days may be 30 days, 60 days, 90 days, or 180 days or less.

Figure 4:
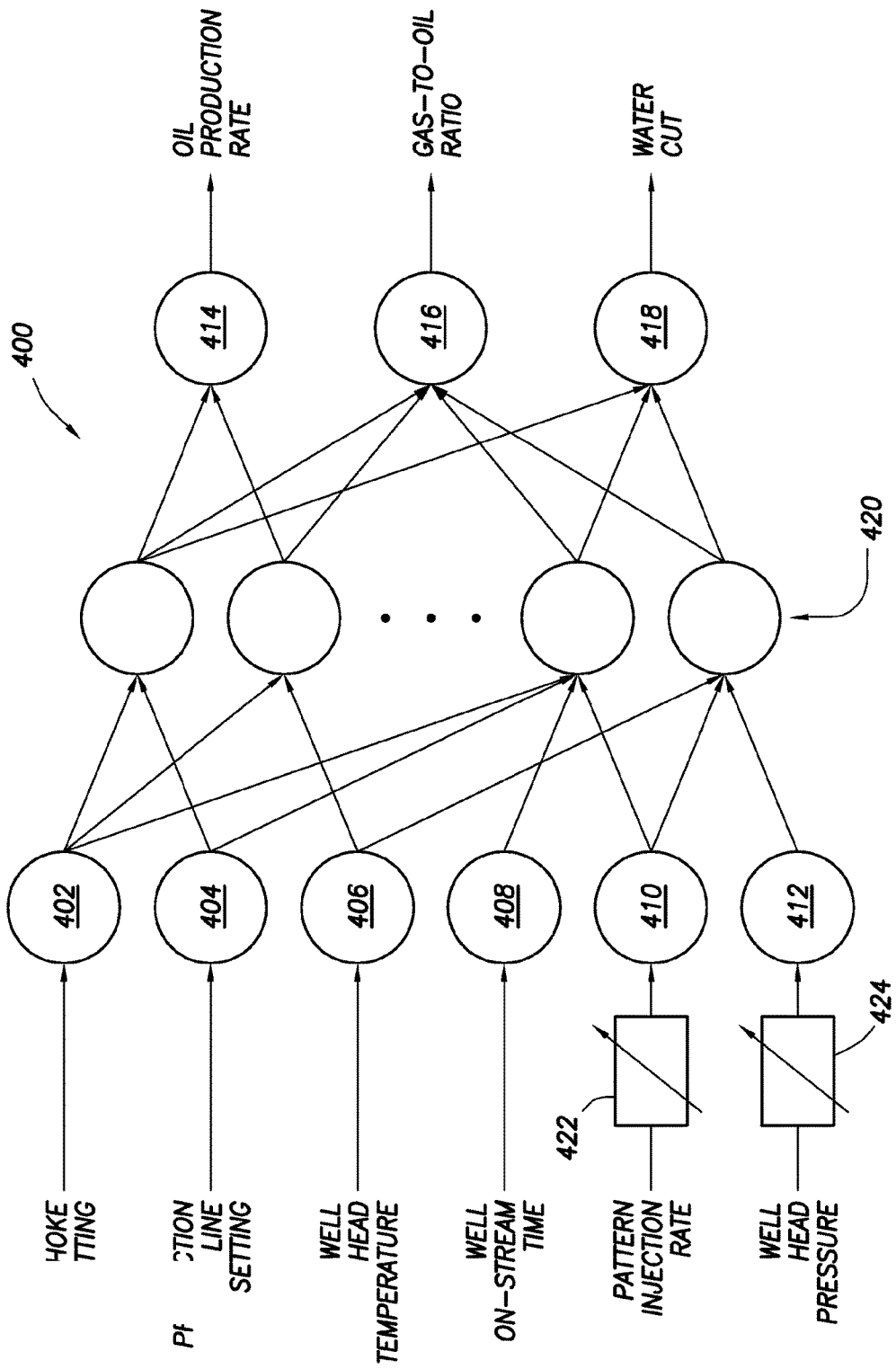
FIG. 4 shows a logical connection system for a neural network in accordance with at least some embodiments.

FIG. 4 shows a logical construction of a neural network 400 in relation to the example input data and example output data. In particular, FIG. 4 illustratively shows seven input nodes, a single hidden layer, and three output nodes. The example logical construction is with respect to a natural flowing hydrocarbon well, and thus should be not viewed as limiting the number input data points and output data points. Hydrocarbon wells using other types of lift may have different input and output data points. In the example of FIG. 4, seven pieces of real-time data are applied to the input nodes. Real-time choke setting is applied to input node 402, and represents the current choke valve setting for the hydrocarbon well. The real-time production line pressure is applied to input node 404, and represents the pressure in the production line, which pressure must be overcome to push hydrocarbons into the production line. The real-time well head temperature is applied to input node 406, and represents temperature of the hydrocarbons existing the wellhead. The time on-stream is applied to input node 408, the time on-stream representing the amount of time the well has been producing (i.e., time since last shut in). The pattern injection rate is applied to input node 410, which pattern injection rate represents the rate of injection of secondary recovery fluid within the recovery zone (i.e., injection wells that affect the hydrocarbon well under scrutiny). Finally, the real-time well head pressure is applied to the input node 412, which is the pressure of the hydrocarbons measured at the wellhead.

Using the illustrative input data, the neural network produces at least one value indicative of future hydrocarbon production for a predetermined period of time (e.g., 30 or 60 days), but in most cases not to exceed 180 days. In the illustrative case of FIG. 4, three illustrative values are created. Output node 414 may produce one or more values of oil production rate over the predetermined period. Illustrative output node 416 may produce one or more values of gas-to-oil ratio over the predetermined period of time. Illustrative output node 418 may produce one or more values of water cut over the predetermined period of time. The production of the values at the output nodes is based on the values presented at the input nodes, as well as one more hidden nodes 420. The illustrative connections between the nodes, and the number of hidden nodes, are merely for illustrative purposes.

In accordance with at least some embodiments, the neural network 400 produces a series of output values for the respective parameters over the predetermined period of time. For example, each output node may produce daily values over the predetermined period of time, or hourly values over the predetermined period of time. In addition to, or in place of, the series of output values, each output node may produce or provide multiple sets of values. The neural network is a data model or statistical model based on data, and thus the output produced may be associated with confidence intervals. For example, each output node of the neural network may produce several series of output values, each series associated with a particular confidence interval (e.g., P10 (10% confidence interval), P50 (50% confidence interval), or P90 (90% confidence interval)). Knowing the confidence interval may assist the production engineer in deciding what actions should be taken.

In accordance with yet still further embodiments, the production engineer may have the ability to change the data applied to the neural network 400 to test various scenarios. The ability to change the data applied from the real-time data is illustrated by blocks 422 and 424 associated with input nodes 410 and 412, respectively. In particular, the arrows through each block 422 and 424 indicate that the data may be changed or transformed through the block (e.g., a software routine). In the case of FIG. 4, the parameters that may be changed from the actual real-time parameters are illustratively the pattern injection rate and the well head pressure. Other real-time parameters may also be changed. Thus, by changing parameters by way of blocks 422 and/or 424, the production engineer may test how changes in such parameters affect the predicted values of future hydrocarbon production. Unlike large physics-based models (e.g., geocellular models), the change of the input parameters to the neural network 400 propagates through the neural network 400 and produces changes in the predicted parameters in real-time. In many cases, depending on the complexity of the neural network and speed of the computer system which implements the programs that implement the neural network, changes implemented by way of blocks 422 and/or 424 are animated in real-time. That is, as the production engineer interacts with the interface mechanism (discussed more below), the changes to the predicted parameters are shown in real-time with the interaction.

Figure 5:
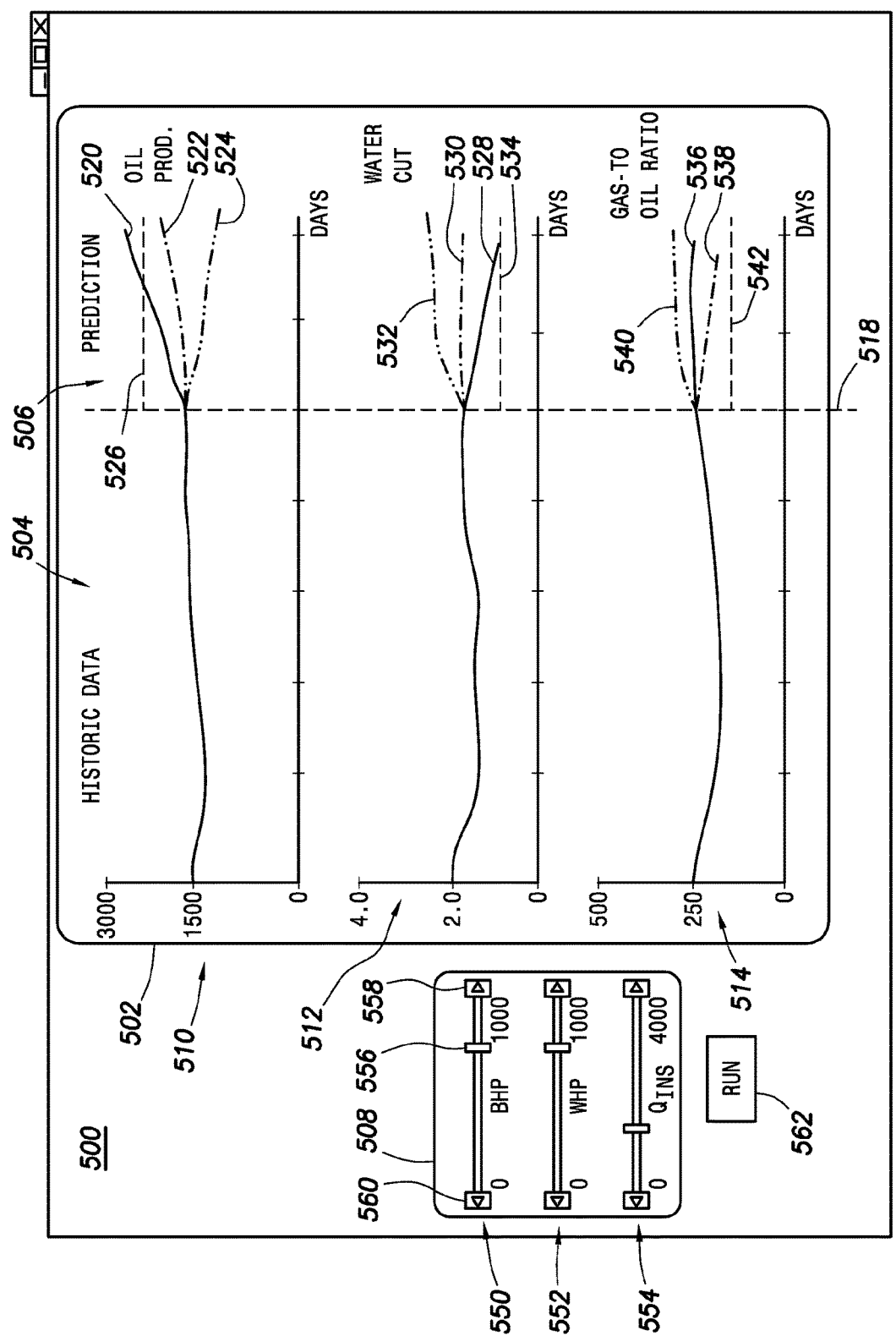
FIG. 5 shows a user interface in accordance with at least some embodiments.

FIG. 5 shows a user interface in accordance with at least some embodiments. In particular, FIG. 5 shows a window or pane 500 within which various other panes are disposed. One such pane is pane 502 showing both historic data in portion 504, as well as portion 506 containing various predicted future values related to hydrocarbon production. Moreover, a pane 508 is shown which contains a plurality of interface mechanism with which a production engineer may interact to test various scenarios.

Turning more specifically to pane 502. Pane 502 illustrative shows three plots 510, 512, and 514. Plot 510 is of both historic data regarding the illustrative oil production for a particular well, as well as predicted values. Plot 512 is of both historic data regarding the illustrative water cut for the particular well, as well as predicted values. Plot 514 is of both historic data regarding the illustrative gas-to-oil ratio for the particular well, as well as predicted values. Other production parameters may be equivalently used. The break point between historic values and predicted values is delineated by vertical line 518. As discussed above, the underlying data model predicts each of the illustrative production parameters a predetermined time into the future, the prediction based, at least in part, on the real-time values of various parameters. The predictions for each parameter in some cases involve multiple predictions, with each prediction having a distinct confidence interval. In the illustrative case of the oil production plot 510, three series of values are shown: solid line 520 illustratively shows predicted oil production over time with a P10 confidence interval; dash-dot-dash line 522 illustratively shows predicted oil production over time with a P50 confidence interval; and dash-dot-dot-dash line 524 illustratively shows predicted oil production over time with a P90 confidence interval. In some cases, also plotted is the planned oil production for the particular well, shown by dashed line 526. It is noted that in FIG. 5 the lines showing each series of values with distinct confidence intervals are fanned out so as not to obscure the various confidence intervals, and are not necessarily representative of the differences in predicted values for each confidence interval to be expected in actual use.

In the illustrative case of the water cut plot 512, three series of values are shown: solid line 528 illustratively shows predicted water cut over time with a P10 confidence interval; dash-dot-dash line 530 illustratively shows predicted water cut over time with a P50 confidence interval; and dash-dot-dot-dash line 532 illustratively shows predicted water cut over time with a P90 confidence interval. In some cases, also plotted is the planned water cut for the particular well, shown by dashed line 534.

Finally, in the illustrative case of the gas-to-water ratio plot 514, three series of values are shown: solid line 520 illustratively shows gas-to-water ratio over time with a P10 confidence interval; dash-dot-dash line 538 illustratively shows predicted gas-to-water ratio over time with a P50 confidence interval; and dash-dot-dot-dash line 540 illustratively shows predicted gas-to-water ratio over time with a P90 confidence interval. In some cases, also plotted is the planned gas-to-water ratio for the particular well, shown by dashed line 542.

Thus, based on current real-time parameters the data model predicts future parameters of the hydrocarbon production, thus giving the production engineer a look into the future to see if parameters need to be changed to meet various goals. In order to test various scenarios, some embodiments implement pane 508 having a plurality of interface mechanisms. In particular, three interface mechanisms 550, 552, and 554 are shown in pane 508. The upper interface mechanism 550 illustratively enables the production engineer to change the datum associated with bottom hole pressure (BHP) to test how such changes affect the predicted values in pane 502. In at least some embodiments, the initial setting for the BHP parameter applied to the data model is the real-time value, but the interface mechanism 550 enables a change from the real-time value to be applied. In the illustrative case of FIG. 5, the change may be implemented by sliding slider bar 556, or interacting with push-buttons 558 or 560. Other interface mechanisms are possible, such as knobs and direct entry text boxes.

The center interface mechanism 552 illustratively enables the production engineer to change the datum associated with wellhead pressure (WHP) to test how such changes affect the predicted values in pane 502. In at least some embodiments, the initial setting for the WHP parameter applied to the data model is the real-time value, but the interface mechanism 552 enables a change from the real-time value to be applied. In the illustrative case of FIG. 5, the change may be implemented by sliding a slider bar, interacting with push-buttons, or other suitable mechanisms.

The lower interface mechanism 554 illustratively enables the production engineer to change the datum associated with secondary recovery fluid injection rate (Qinj) to test how such changes affect the predicted values in pane 502. In at least some embodiments, the initial setting for the secondary recovery fluid injection rate applied to the data model is the real-time value, but the interface mechanism 554 enables a change from the real-time value to be applied. In the illustrative case of FIG. 5, the change may be implemented by sliding a slider bar, interacting with push-buttons, or other suitable mechanisms.

In some cases, changing a parameter applied to the data model by interaction with the interface mechanism in pane 508 results a change in the predicted values in real time. That is, as the illustrative slider bar is moved and/or the push buttons pushed, changes to the predicted values are changed in real-time with the interaction. The real-time changes to the predicted values thus yield results much faster than related-art physics-based models, which may takes hours or even days to set up and run. In yet still other cases, changes may be made by interaction with the interface mechanism, but such changes not implemented unless and until the run button 562 is pressed.

The various embodiments discussed to this point regarding predicting future values related to hydrocarbon production have been in relation to a single hydrocarbon well; however, in other circumstances a production engineer may be interested in the interaction between injection wells and hydrocarbon wells, not just how changes in injection rate may affect a single well. To that end, the numerical modeling program 202 in accordance with at least some embodiments also determines correlations between injector wells and hydrocarbon wells. In some cases, the neural network, during training (discussed below), may determine correlations between injector wells and each hydrocarbon well in order to make predictions, and thus the neural network may produce an output indicative of such correlations. In other cases, the numerical modeling program 202 may have other software components or modules that calculate statistical correlations between injector wells and hydrocarbon wells, such as using Pearson's Correlation. Other correlation mechanisms may be equivalently used. Regardless of the precise mathematical mechanism for determining the correlations, in at least one embodiment the correlations are made based on a rolling window of daily data, and more particular a rolling one year window of daily data. Other time periods for the rolling window may be equivalently used.

Figure 6:
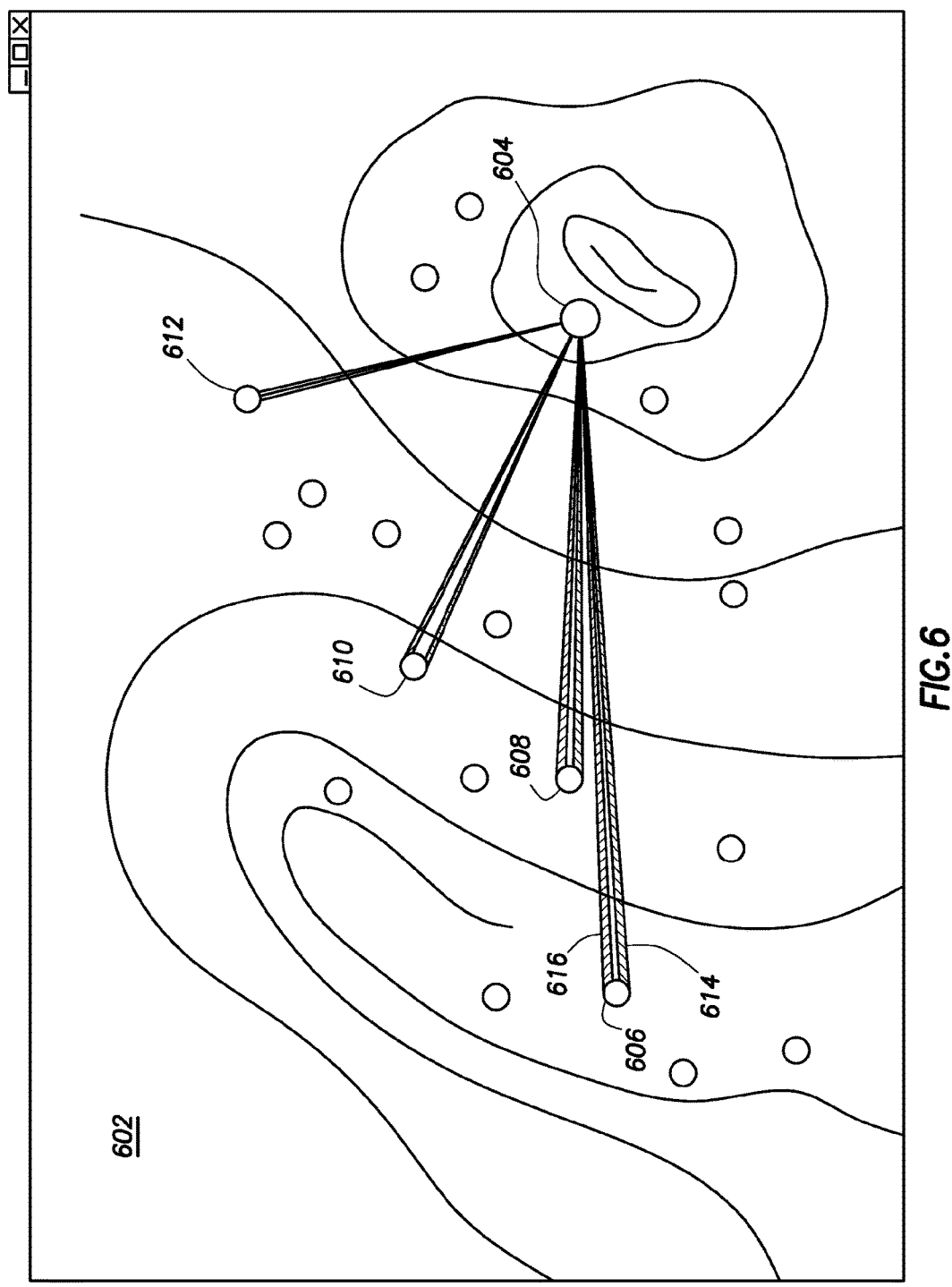
FIG. 6 shows a user interface in accordance with at least some embodiments.

FIG. 6 shows a user interface in accordance with at least some embodiments. In particular, user interface 600 comprises a pane 602 that shows an overhead view of at least a portion of the hydrocarbon field, and thus shows some or all of the hydrocarbon wells in the field. In the illustration of FIG. 6, the relative horizontal location of each well is shown by a circle. In some cases the overhead view may be an actual high altitude picture of the field (e.g., taken by airplane, or taken by satellite), with graphics embedded thereon showing the relative location of each well. In other cases, and as illustrated, the overhead view may be a topographical map, again with graphics embedded thereon showing the relative location of each hydrocarbon well. In yet still further cases, the view in the first pane 402 may merely show the relative horizontal location of each hydrocarbon well. Other arrangements are possible.

In accordance with these embodiments, a production engineering viewing the user interface of FIG. 6 selects a hydrocarbon well, such as hydrocarbon well 604. Selection of the hydrocarbon well 604 informs the numerical modeling program 202 that the production engineer would like to see a visualization of the correlations between injector wells and the selected hydrocarbon wells. For the illustrative hydrocarbon field of FIG. 6, the injector wells are wells 606, 608, 610 and 612. In accordance with at least some embodiments, the correlation between each injector well and the hydrocarbon well 604 is shown by bands extending between each injector well and the selected hydrocarbon well 604. Taking injection well 606 as representative, two bands 614 and 616 extend between the injection well 606 and the selected hydrocarbon well 604. One band, for example band 614, depicts the correlation between injection rate at the injection well 606, and the oil production rate at the selected hydrocarbon well 604. In one embodiment, the band 614 is color-coded to indicate the correlation type (i.e., oil production), and in some cases the band is purple, but other colors may be used. In one embodiment, the greater the correlation between injection rate at the injection well 606 and the oil production rate at the hydrocarbon well 604, the wider the band 614. Other indications may be used in place of, or in addition to, the width of the band depicting strength of the correlation, such as different colors for different correlations, or different intensity of the color (e.g., brightness) depicting strength of the correlation.

Another band, for example band 616, depicts the correlation between injection rate at the injection well 606, and the water production rate at the selected hydrocarbon well 604. In one embodiment, the band 616 is color-coded to indicate the correlation type (i.e., water production), and in some cases the band is blue, but other colors may be used. In one embodiment, the greater the correlation between injection rate at the injection well 606 and the water production rate at the hydrocarbon well 604, the wider the band 614. Other indications may be used in place of, or in addition to, the width of the band depicting strength of the correlation, such as different colors for different correlations, or different intensity of the color (e.g., brightness) depicting strength of the correlation.

Thus, in the illustrative user interface 600 of FIG. 6 there is a strong correlation between the injection rate at injection well 606 to oil and water production at the selected hydrocarbon well 604. Likewise for illustrative injection well 608, there is illustrated a strong correlation to both water and oil production at the selected hydrocarbon well 604. By contrast, illustrative FIG. 6 shows a very weak correlation between the injection rate at the injection well 612 and the selected hydrocarbon well 604. Assuming all the wells depicted are within the same sweep pattern, the situation in FIG. 6 may show good sweep efficiency extending between injection wells 606 and 608, marginal sweep efficiency between injection well 610 and the selected hydrocarbon well 604, and poor sweep efficiency toward injection well 612. On the other hand, if injection well 612 belongs in a different sweep pattern, the correlation may show an unwanted sweep pattern relative to other hydrocarbon wells intended to be in the sweep pattern with injection well 612.

In embodiments where a neural network is used in whole or in part to make the future hydrocarbon production predictions and/or correlations between injection rate an injection wells and hydrocarbon wells, training of the neural network may be needed for the system to provide relevant data. In accordance with at least some embodiments, the neural network is trained using historical data for the hydrocarbon producing field of interest. In many cases, one year or more of historical data is gathered (e.g., from database 204 or the SCADA system 206) and used to train the neural network. More particularly a year more of daily values of each parameter of interest is extracted from any relevant database. The extracted data may then be applied to any of a variety of commercially available programs that create and/or train neural networks, such as the ASSETSOLVER® brand programs available from Landmark Graphics Corporation of Houston, Tex. Once the selected data is applied, the neural network is trained, re-trained, or in the first instance created. The created and/or trained neural network may then be moved or copied to an appropriate computer system 200, and more particularly to the numerical modeling program 202 in the various embodiments.

Figure 7:
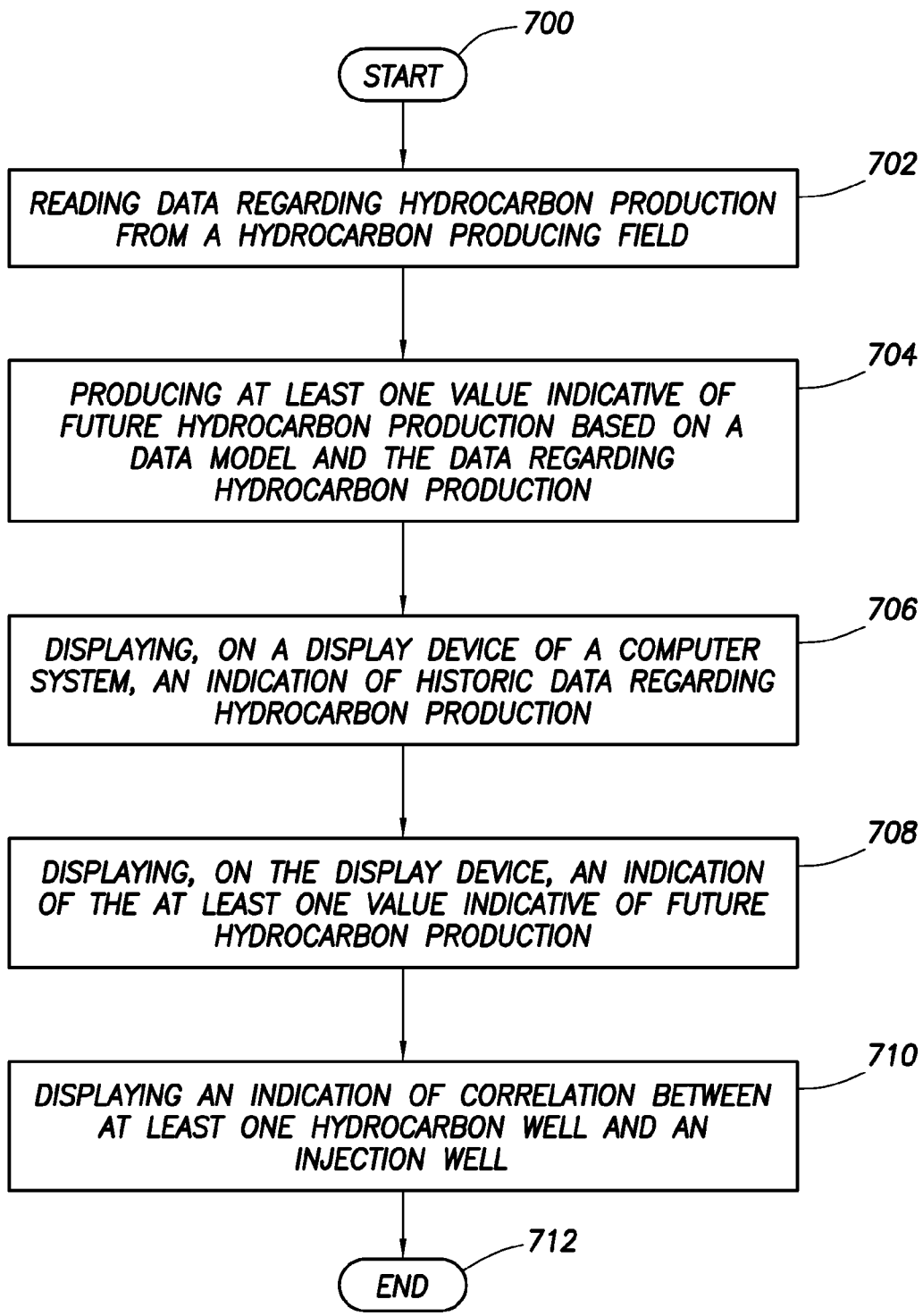
FIG. 7 shows a method in accordance with at least some embodiments.

FIG. 7 shows a method in accordance with at least some embodiments. In particular, the method starts (block 700) and comprises: reading data regarding hydrocarbon production from a hydrocarbon producing field (block 702); producing at least one value indicative of future hydrocarbon production based on a data model and the data regarding hydrocarbon production (block 704); displaying, on a display device of a computer system, an indication of historic data regarding hydrocarbon production (block 706); displaying, on the display device, an indication of the at least one value indicative of future hydrocarbon production (block 708); and displaying an indication of correlation between at least one hydrocarbon well and an injection well (block 710). Thereafter the method ends (block 712), in some cases to be immediately restated.

Figure 8:
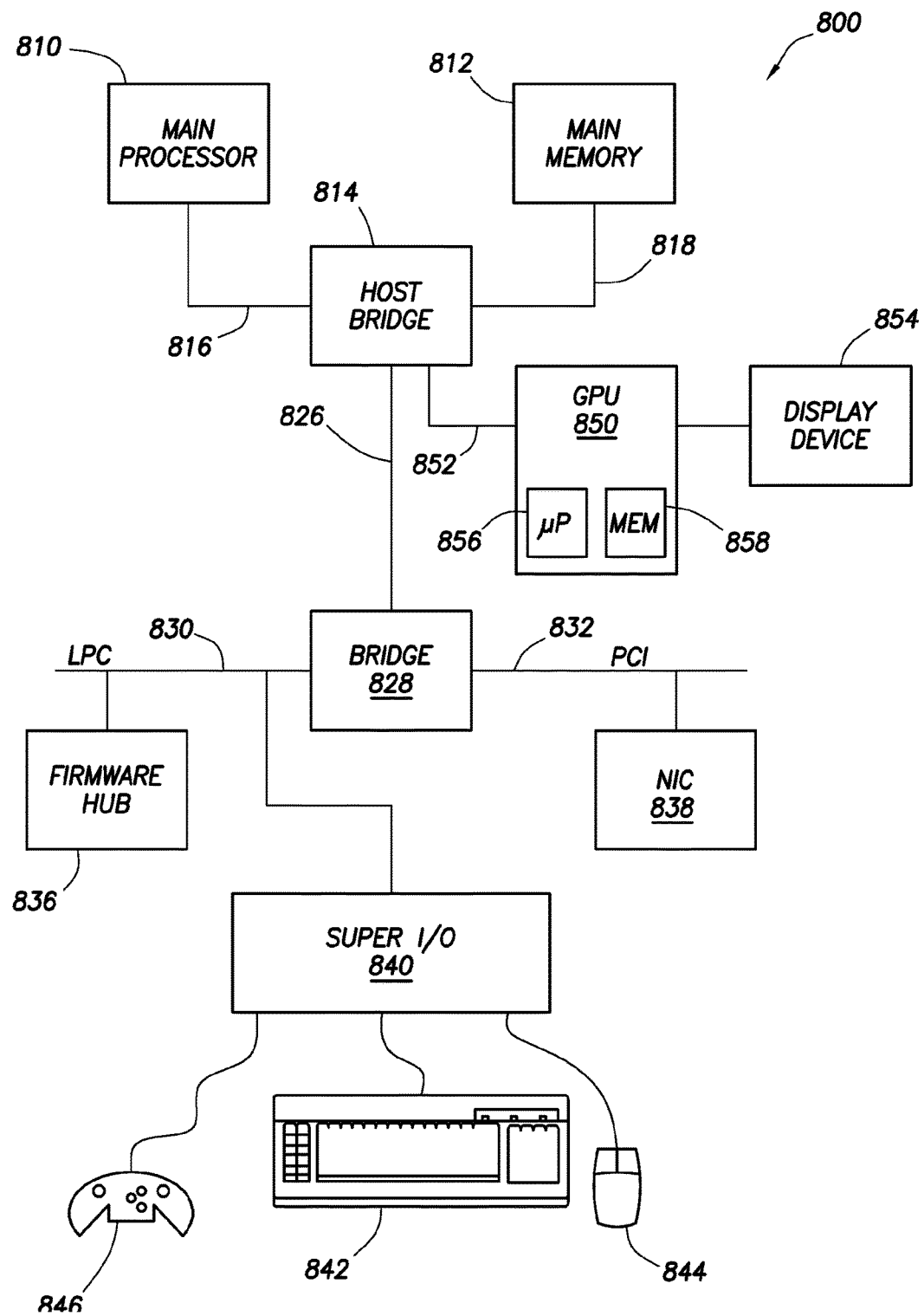
FIG. 8 shows a block diagram of a computer system in accordance with at least some embodiments.

FIG. 8 illustrates a computer system 800 in accordance with at least some embodiments. Any or all of the embodiments that involve predicting values of future hydrocarbon production, displaying predicted future hydrocarbon production, displaying correlations between injection wells and hydrocarbon wells, and/or displaying of user interfaces may be implemented in whole or in part on a computer system such as that shown in FIG. 8, or after-developed computer systems. In particular, computer system 800 comprises a main processor 810 coupled to a main memory array 812, and various other peripheral computer system components, through integrated host bridge 814. The main processor 810 may be a single processor core device, or a processor implementing multiple processor cores. Furthermore, computer system 800 may implement multiple main processors 810. The main processor 810 couples to the host bridge 814 by way of a host bus 816, or the host bridge 814 may be integrated into the main processor 810. Thus, the computer system 800 may implement other bus configurations or bus-bridges in addition to, or in place of, those shown in FIG. 8.

The main memory 812 couples to the host bridge 814 through a memory bus 818. Thus, the host bridge 814 comprises a memory control unit that controls transactions to the main memory 812 by asserting control signals for memory accesses. In other embodiments, the main processor 810 directly implements a memory control unit, and the main memory 812 may couple directly to the main processor 810. The main memory 812 functions as the working memory for the main processor 810 and comprises a memory device or array of memory devices in which programs, instructions and data are stored. The main memory 812 may comprise any suitable type of memory such as dynamic random access memory (DRAM) or any of the various types of DRAM devices such as synchronous DRAM (SDRAM), extended data output DRAM (EDO-DRAM), or Rambus DRAM (RDRAM). The main memory 812 is an example of a non-transitory computer-readable medium storing programs and instructions, and other examples are disk drives and flash memory devices.

The illustrative computer system 800 also comprises a second bridge 828 that bridges the primary expansion bus 826 to various secondary expansion buses, such as a low pin count (LPC) bus 830 and peripheral components interconnect (PCI) bus 832. Various other secondary expansion buses may be supported by the bridge device 828.

Firmware hub 836 couples to the bridge device 828 by way of the LPC bus 830. The firmware hub 836 comprises read-only memory (ROM) which contains software programs executable by the main processor 810. The software programs comprise programs executed during and just after power on self test (POST) procedures as well as memory reference code. The POST procedures and memory reference code perform various functions within the computer system before control of the computer system is turned over to the operating system. The computer system 800 further comprises a network interface card (NIC) 838 illustratively coupled to the PCI bus 832. The NIC 838 acts to couple the computer system 800 to a communication network, such the Internet, or local- or wide-area networks.

Still referring to FIG. 8, computer system 800 may further comprise a super input/output (I/O) controller 840 coupled to the bridge 828 by way of the LPC bus 830. The Super I/O controller 840 controls many computer system functions, for example interfacing with various input and output devices such as a keyboard 842, a pointing device 844 (e.g., mouse), a pointing device in the form of a game controller 846, various serial ports, floppy drives and disk drives. The super I/O controller 840 is often referred to as "super" because of the many I/O functions it performs.

The computer system 800 may further comprise a graphics processing unit (GPU) 850 coupled to the host bridge 814 by way of bus 852, such as a PCI Express (PCI-E) bus or Advanced Graphics Processing (AGP) bus. Other bus systems, including after-developed bus systems, may be equivalently used. Moreover, the graphics processing unit 850 may alternatively couple to the primary expansion bus 826, or one of the secondary expansion buses (e.g., PCI bus 832). The graphics processing unit 850 couples to a display device 854 which may comprise any suitable electronic display device upon which any image or text can be plotted and/or displayed. The graphics processing unit 850 may comprise an onboard processor 856, as well as onboard memory 858. The processor 856 may thus perform graphics processing, as commanded by the main processor 810. Moreover, the memory 858 may be significant, on the order of several hundred megabytes or more. Thus, once commanded by the main processor 810, the graphics processing unit 850 may perform significant calculations regarding graphics to be displayed on the display device, and ultimately display such graphics, without further input or assistance of the main processor 810.

In the specification and claims, certain components may be described in terms of algorithms and/or steps performed by a software application that may be provided on a non-transitory storage medium (i.e., other than a carrier wave or a signal propagating along a conductor). The various embodiments also relate to a system for performing various steps and operations as described herein. This system may be a specially-constructed device such as an electronic device, or it may include one or more general-purpose computers that can follow software instructions to perform the steps described herein. Multiple computers can be networked to perform such functions. Software instructions may be stored in any computer readable storage medium, such as for example, magnetic or optical disks, cards, memory, and the like.

At least some of the illustrative embodiments are methods including: reading data regarding hydrocarbon production from a hydrocarbon producing field; producing at least one value indicative of future hydrocarbon production based on a data model and the data regarding hydrocarbon production; displaying, on a display device of a computer system, an indication of historic data regarding hydrocarbon production; and displaying, on the display device, an indication of the at least one value indicative of future hydrocarbon production.

The example method may further comprise displaying an indication of correlation between at least one hydrocarbon well and an injection well.

Wherein producing in the example method may further comprise producing using, at least in part, an artificial neural network. Wherein producing in the example method may further comprise producing the at least one value indicative of future hydrocarbon production based on a value indicated by an interface mechanism displayed on the display device. Producing may further comprise changing the at least one value indicative of future hydrocarbon production responsive to a user changing the value indicated by the interface device.

In the example method, producing may further comprises producing a plurality of values, each value associated with a different confidence interval. IN yet still further example methods, producing may further comprise producing a time series of values indicative of future hydrocarbon production, the time series spanning a predetermined time (30 days; 60 days; 90 days; and less than 180 days).

Other example embodiments are systems comprising: a plurality of hydrocarbon producing wells; a plurality of measurement devices associated one each with each of the plurality of hydrocarbon producing wells, each measurement device measures at least one parameter associated with hydrocarbon flow; a computer system comprising a processor, a memory coupled to the processor, and a display device. The memory stores a program that, when executed by the processor, causes the processor to: read well data regarding the at least one parameter associated with hydrocarbon flow for a particular well of the plurality of hydrocarbon producing wells; display, on the display device, an interface mechanism that, responsive to interaction by a user, changes at least one datum of the well data creating an adjusted datum; predict future production parameters of the particular well, the predicting creates a series of values, and the predicting based on a data model, well data and the adjusted datum; and display, on the display device, a visual depiction of the series of values.

With respect to predicting, in other example systems, the program may cause the processor to create the series of values being a time series. With respect to predicting, in yet still other example systems, the program may cause the processor to create the series of values, each value having a distinct confidence interval. With respect to predicting, in still other example systems, the program may cause the processor to predict using, at least in part, an artificial neural network.

With respect to displaying, in other example systems, the program may cause the processor to display an indication of historic data regarding the at least one parameter associated with hydrocarbon flow for the particular well. In yet still other example systems, the program may further cause the processor to predict future production parameters of the particular well responsive to a change in the adjusted datum. The adjusted datum may be at least one selected from the group consisting of: injection rate of secondary recover fluid at an injection well; choke setting for the particular well; bottom-hole pressure for the particular well; well head pressure for the particular well; gas lift pressure for the particular well; and submersible pump speed for the particular well.

In other example systems, the program may further cause the processor to display an indication of correlation between well data of the particular well and an injection well.

Other example embodiments are non-transitory computer-readable mediums storing programs that, when executed by a processor, causes the processor to: read well data regarding production parameters for a hydrocarbon producing well; display, on display device coupled to the processor, an interface mechanism that, responsive to interaction by a user, changes at least one datum of the well data thereby creating an adjusted datum; predict production parameters for the hydrocarbon producing well over a predetermine future, the predicting creates a series of values, and the predicting based on a data model, well data, and the adjusted datum; display, on the display device, historic data regarding production parameters of the hydrocarbon producing well; and display, on the display device, a visual depiction of the series of values.

With respect to predicting, in other example computer-readable mediums, the program may cause the processor to create the series of values being a time series. With respect to predicting, in yet still other computer-readable mediums, the program may cause the processor to create the series of values, each value having a distinct confidence interval. With respect to predicting, in still other example computer-readable mediums, the program may cause the processor to predict using, at least in part, an artificial neural network.

With respect to displaying, in other example computer-readable mediums, the program may cause the processor to display an indication of historic data regarding the at least one parameter associated with hydrocarbon flow for the particular well. In yet still other example computer-readable mediums, the program may further cause the processor to predict future production parameters of the particular well responsive to a change in the adjusted datum. The adjusted datum may be at least one selected from the group consisting of: injection rate of secondary recover fluid at an injection well; choke setting for the particular well; bottom-hole pressure for the particular well; well head pressure for the particular well; gas lift pressure for the particular well; and submersible pump speed for the particular well.

In other example computer-readable mediums, the program may further cause the processor to display an indication of correlation between well data of the particular well and an injection well.

References to "one embodiment", "an embodiment", "a particular embodiment" indicate that a particular element or characteristic is included in at least one embodiment of the invention. Although the phrases "in one embodiment", "an embodiment", and "a particular embodiment" may appear in various places, these do not necessarily refer to the same embodiment.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments and/or to create a non-transitory computer-readable media (i.e., not a carrier wave) that stores a software program to implement the method aspects of the various embodiments.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The invention claimed is:

1. A method comprising:
   obtaining, by a computer system from a plurality of measurement devices via a communication network, measurements regarding hydrocarbon production from a hydrocarbon producing field;
   applying the obtained measurements as input data to a data model to produce output data including a set of values of a predicted parameter of future hydrocarbon production for at least one hydrocarbon well within the hydrocarbon producing field, wherein the set of values is associated with a plurality of confidence intervals, each confidence interval includes at least one value in the set of values, and the output data is produced by the data model without simulating fluid movement within the hydrocarbon producing field;
   adjusting at least one input parameter associated with hydrocarbon production for the at least one hydrocarbon well, based on at least one value in the set of values of the predicted parameter of future hydrocarbon production; and
   controlling hydrocarbon production from the at least one hydrocarbon production well based on the at least one adjusted input parameter.

2. The method of claim 1, wherein the output data produced by the data model is indicative of a correlation between the at least one hydrocarbon well and an injection well within the hydrocarbon producing field, and the method further comprises:
   displaying, on a display device coupled to the computer system, an indication of the correlation between the at least one hydrocarbon well and the injection well;
   displaying, on the display device, an indication of historic data regarding hydrocarbon production; and
   displaying, on the display device, an indication of the set of values of the predicted parameter of future hydrocarbon production.

3. The method of claim 1 wherein the data model is an artificial neural network.

4. The method of claim 2 wherein the set of values of the predicted parameter of future hydrocarbon production is produced by the data model based in part on a value of the input data as indicated by an interface mechanism displayed on the display device.

5. The method of claim 4 wherein the set of values of the predicted parameter of future hydrocarbon production as produced by the data model changes responsive to a user changing the value indicated by the interface mechanism.

6. The method of claim 1 wherein the predicted parameter is one of a plurality of predicted parameters of future hydrocarbon production, the output data produced by the data model includes a plurality of sets of values corresponding to the plurality of predicted parameters of future hydrocarbon production, and each set in the plurality of sets includes values associated with the plurality of confidence intervals for a different one of the plurality of predicted parameters.

7. The method of claim 1 wherein the output data produced by the data model includes a time series of values indicative of future hydrocarbon production, the time series spanning a predetermined time.

8. The method of claim 7 wherein the predetermined time is at least one selected from the group consisting of: 30 days; 60 days; 90 days; and less than 180 days.

9. A system comprising:
   a processor;
   a memory coupled to the processor, the memory storing a program that, when executed by the processor, causes the processor to:
   obtain, from a plurality of measurement devices via a communication network, measurements regarding at least one input parameter associated with hydrocarbon production for at least one of a plurality of hydrocarbon wells within a hydrocarbon producing field;
   apply the measurements as input data to a data model to predict a set of values of a predicted parameter of future hydrocarbon production for the at least one hydrocarbon well, wherein the set of values is associated with a plurality of confidence intervals, each confidence interval includes at least one value in the set of values, and the output data is produced by the data model without simulating fluid movement within the hydrocarbon producing field;
   adjust the at least one input parameter associated with hydrocarbon production for the at least one hydrocarbon well, based on the predicted set of values of the predicted parameter of future hydrocarbon production; and
   control hydrocarbon production from the at least one hydrocarbon well within the hydrocarbon producing field, based on the adjustment to the at least one input parameter.

10. The system of claim 9 wherein the predicted set of values of future hydrocarbon production include a time series of values.

11. The system of claim 9 wherein the predicted parameter is one of a plurality of predicted parameters of future hydrocarbon production, the output data produced by the data model includes a plurality of sets of values corresponding to the plurality of predicted parameters, and each set in the plurality of sets includes predicted values associated with the plurality of confidence intervals for a different one of the plurality of predicted parameters.

12. The system of claim 9 wherein the program further causes the processor to display, via a user interface on a display device, a visual depiction of the set of values of the predicted parameter of future hydrocarbon production and an indication of historic values of the at least one input parameter associated with hydrocarbon production for the at least one hydrocarbon well, the user interface having an interface mechanism that, responsive to interaction by a user, adjusts at least one datum of the input data applied to the data model.

13. The system of claim 12, wherein the program further causes the processor to adjust the visual depiction of the predicted set of values responsive to the adjusted datum applied to the data model.

14. The system of claim 13 wherein the adjusted datum is at least one selected from the group consisting of: injection rate of secondary recover fluid at an injection well; choke setting for the at least one hydrocarbon well; bottom-hole pressure for the particular well; well head pressure for the particular well; gas lift pressure for the particular well; and submersible pump speed for the particular well.

15. The system of claim 9 wherein the data model is an artificial neural network.

16. The system of claim 9 wherein the data model produces output data indicative of a correlation between the at least one input parameter associated with the at least one hydrocarbon well and an injection well within the hydrocarbon producing field, based on the applied input data, and the program further causes the processor to display an indication of the correlation.

17. A non-transitory computer-readable medium storing a program that, when executed by a processor, causes the processor to:
 obtain, from a plurality of measurement devices via a communication network, measurements regarding input parameters for a hydrocarbon well within a hydrocarbon producing field;
 apply the measurements as input data to a data model to predict a set of values of a predicted parameter of future hydrocarbon production for the hydrocarbon well over a predetermined period of time, wherein the set of values is associated with a plurality of confidence intervals, each confidence interval includes at least one value in the set of values, and the output data is produced by the data model without simulating fluid movement within the hydrocarbon producing field;
 adjust at least one of the input parameters for the hydrocarbon well, based on the predicted set of values of the predicted parameter of future hydrocarbon production; and
 control hydrocarbon production from the hydrocarbon well within the hydrocarbon producing field, based on the adjustment to the at least one input parameter.

18. The non-transitory computer-readable medium of claim 17 wherein the predicted parameter is one of a plurality of predicted parameters of future hydrocarbon production, the output data produced by the data model includes a plurality of sets of values corresponding to the plurality of predicted parameters, and each of the predicted set of values include a series of values corresponding to the plurality of confidence intervals for a different one of the plurality of predicted parameters.

19. The non-transitory computer-readable medium of claim 17 wherein the program further causes the processor to display, via a display device, a visual depiction of the predicted set of values, and to change the visual depiction of the predicted values responsive to a user adjusting, via an interface mechanism displayed on the display device, at least one datum of the input data applied to the data model.

20. The non-transitory computer-readable medium of claim 19 wherein the adjusted datum is at least one selected from the group consisting of: injection rate of secondary recover fluid at an injection well; choke setting for the hydrocarbon well; bottom-hole pressure for the particular well; well head pressure for the particular well; gas lift pressure for the particular well; and submersible pump speed for the particular well.

21. The non-transitory computer-readable medium of claim 17 wherein the data model is an artificial neural network.

22. The non-transitory computer-readable medium of claim 17 wherein the program further causes the processor to display an indication of correlation between the at least one input parameter of the hydrocarbon well and an injection well within the hydrocarbon producing field.

* * * * *